United States Patent [19]

Li et al.

[11] Patent Number: 4,760,347
[45] Date of Patent: Jul. 26, 1988

[54] CONTROLLED-OUTPUT AMPLIFIER AND POWER DETECTOR THEREFOR

[75] Inventors: Clement H. Li; Ronald P. Green, both of Calgary, Canada

[73] Assignee: NovAtel Communications Ltd., Calgary, Canada

[21] Appl. No.: 4,672

[22] Filed: Jan. 20, 1987

[51] Int. Cl.$^4$ .............................................. H03G 3/20
[52] U.S. Cl. .................................... 330/127; 330/140
[58] Field of Search ............... 329/192; 330/127, 129, 330/130, 131, 134, 138, 140, 279, 280, 296

[56] References Cited

U.S. PATENT DOCUMENTS 3,260,957 7/1966 Kaiser et al. ........................ 330/140
3,382,461 5/1968 Wolcott ............................... 330/140

Primary Examiner—Eugene R. LaRoche
Assistant Examiner—Steven J. Mottola
Attorney, Agent, or Firm—Cesari and McKenna

[57] ABSTRACT

A controlled-output amplifier is provided whose output power level may be set to any of a number of predetermined levels and maintained substantially constant. The amplifier includes a detector which senses the output power level and produces a signal indicative of the magnitude thereof. The detector includes a single detector diode which may be biased to any of a number of preselected bias states by a bias control unit. The bias control unit increases the dynamic range of the detector diode while eliminating the need for a conventional temperature compensation diode.

4 Claims, 3 Drawing Sheets

CONTROLLED-OUTPUT AMPLIFIER AND POWER DETECTOR THEREFOR

BACKGROUND OF THE INVENTION

1. Field of the Invention

The present invention relates to a controlled-output amplifier whose output power may be set to any of a number of predetermined levels. More specifically, it relates to a controllable-gain amplifier whose output is controlled by a servo loop that includes a half-wave rectifier for sensing the output power and whose gain is controllable to maintain a desired power level over a wide range of ambient temperature.

2. Discussion of the Prior Art

Controlled-output amplifiers known in the prior art include a controllable-gain amplifier stage connected in a servo or feedback loop in which the output power is sensed and compared with a reference. The resulting difference or error signal is used to control the gain of the amplifier stage, thereby maintaining the amplifier output at the desired power level. Power sensing is usually accomplished by a diode, frequently referred to as a "detector diode," which is connected to a capacitor to form a half-wave rectifier. However, diodes possess certain characteristics which may produce adverse effects in some applications.

First, if the monitored power levels are relatively low (e.g. on the order of tens of milliwatts or less), the forward voltage drop of the detector diode is large in comparison to the rectified signal and variations in the forward drop may therefore introduce significant errors into the rectified signal.

Unfortunately, the forward voltage drop of a diode is highly temperature dependent. For silicon diodes the forward drop typically varies on the order of $-2$ mV/°C. In addition, the rate of change of the forward drop with respect to temperature is dependent on the bias current flowing through the diode. Thus, over a wide ambient temperature range, the forward voltage drop will vary significantly.

Third, diodes typically provide very limited dynamic ranges. In other words, a diode can sense signals only within a narrow amplitude range without being driven into saturation. In applications where the sensed signal may vary by an order of magnitude or more, the diode may saturate, thereby introducing errors into the rectified signal.

A conventional solution for minimizing the problems with forward voltage drop and drift described above is the application of temperature compensation to the detector diode. In one form of compensation, a "compensation diode" is connected so that its forward drop biases the detector diode at the threshhold of conduction and thus effectively cancels the forward voltage drop of the detector diode. Assuming that the two diodes have "matched" temperature characteristics, their forward voltage drops will substantially track each other as the temperature varies and the detector diode will thereby remained biased at the threshhold of conduction.

There are several disadvantages associated with this type of temperature compensation. First, the detector and compensation diodes must have nearly identical temperature characteristics to ensure close tracking between their forward voltage drops. Such matched diodes are relatively expensive components; typically they must be tested for close matching before they can be assembled in a desired circuit. Second, the two diodes must be located in close thermal proximity to each other in order to minimize any difference in ambient temperature. If a significant temperature difference exists, the forward voltage drops of the two diodes will not be the same and the forward voltage drop of the detector diode will not be effectively cancelled as the temperature varies, resulting in temperature-related variations in the output of the detector diode.

SUMMARY OF THE INVENTION

The present invention provides a controlled-output amplifier whose output power may be set to one of a number of predetermined levels and maintained substantially constant over a wide ambient temperature range. The amplifier comprises a detector which senses the output power of a controllable-gain amplifier stage and produces a half-wave rectified signal in response thereto. The detector includes a diode which may be biased to one of a number of preselected states by a bias control unit. Thus, when the contro)led-output amplifier is operating at relatively low power levels, the diode is biased with a relatively small current. The result is that the diode has a high impedance and a large proportion of the sensed signal appears across the diode. Thus, the diode is configured for maximum sensitivity for sensing the relatively small signals.

Alternatively, if the controlled-output amplifier is operating at relatively high power levels, the bias current of the diode is increased, thereby reducing the impedance of the diode. As a result, a lesser proportion of the sensed signal appears across the diode, which tends to prevent the diode from being driven into saturation.

By virtue of these multiple bias "states", the detector displays a wide dynamic range and is capable of accurately sensing signals which may vary by an order of magnitude or more. Because the bias control unit establishes the correct bias state of the diode regardless of the ambient temperature, there is no need for a conventional compensation diode. Thus, a significant cost savings may be realized by the elimination of both the compensation diode and the accompanying pre-installation testing which is normally required for matched diodes.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
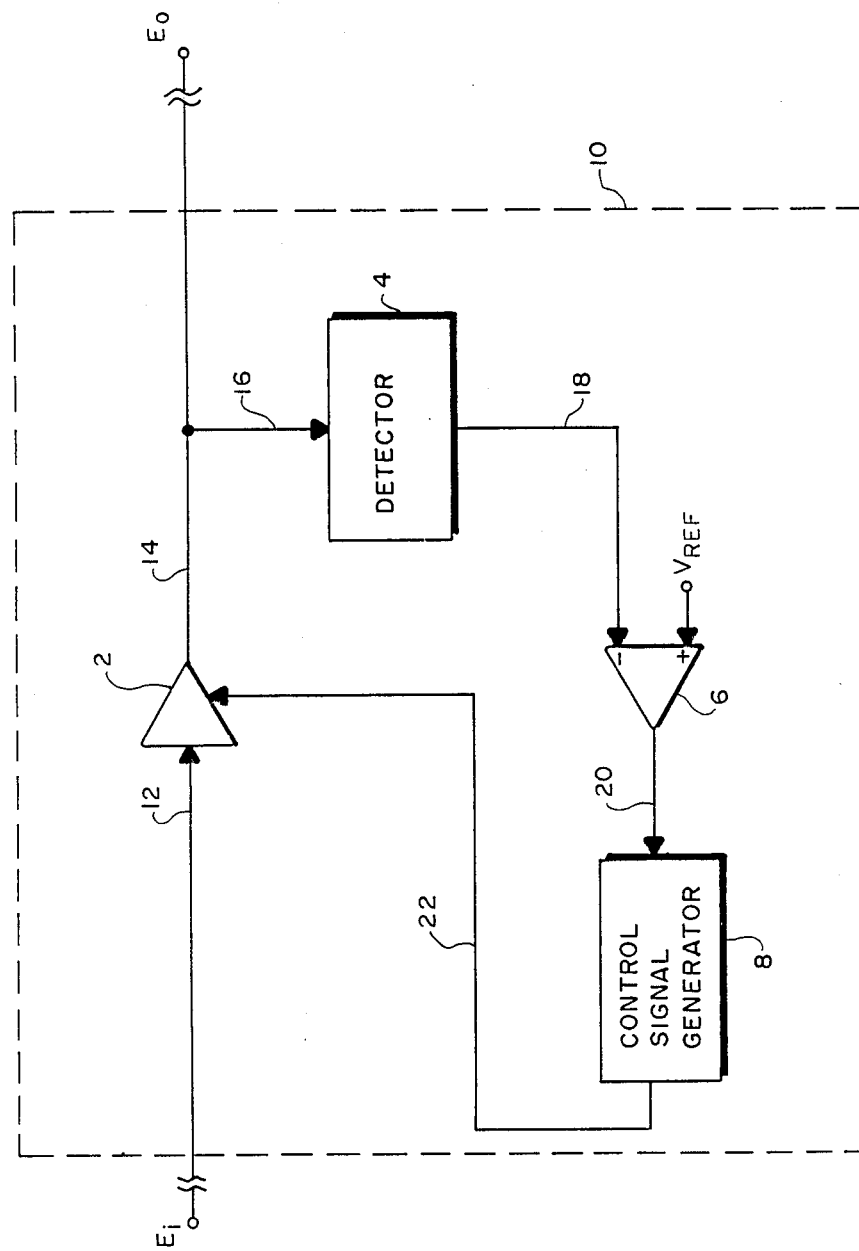
FIG. 1 is a block diagram of a controlled-output amplifier known in the prior art.

FIG. 1 is a block diagram of a controlled-output amplifier 10 known in the prior art. The amplifier 10 includes a feedback or servo loop which operates to maintain the output power at a substantially constant, predetermined level An input signal $E_i$ is received at an input terminal 12 of a controllable-gain amplifier 2. An output signal $E_o$ is provided at an output terminal 14 of the amplifier 2. An input terminal 16 of a detector 4 is connected to the output terminal 14. An output terminal 18 of the detector 4 is connected to an inverting input terminal of a comparator 6. A reference signal $V_{ref}$ is provided to a non-inverting input terminal of the comparator 6. An output terminal 20 of the comparator 6 is connected to a control signal generator 8. Finally, an output terminal 22 of the control signal generator 8 is connected to the controllable-gain amplifier 2.

The detector 4 typically includes a half-wave rectifier, which produces a rectified (DC) signal at output terminal 18 that is indicative of the magnitude of $E_o$. The comparator 6 in turn compares the rectified signal with the reference signal $V_{ref}$ and produces an error signal at output terminal 20 which is indicative of the difference in magnitude of these input signals. In response, the control signal generator 8 produces a signal at output terminal 22 which causes the gain of the amplifier 2 to either increase or decrease so as to reduce the error signal. In this manner, the output power of the amplifier 10 is maintained at a substantially constant level. Additional conventional circuitry (not shown) may be included to provide a plurality of reference signals similar to $V_{ref}$, thereby permitting the amplifier 10 to operate at any of a number of predetermined power levels.

Figure 2:
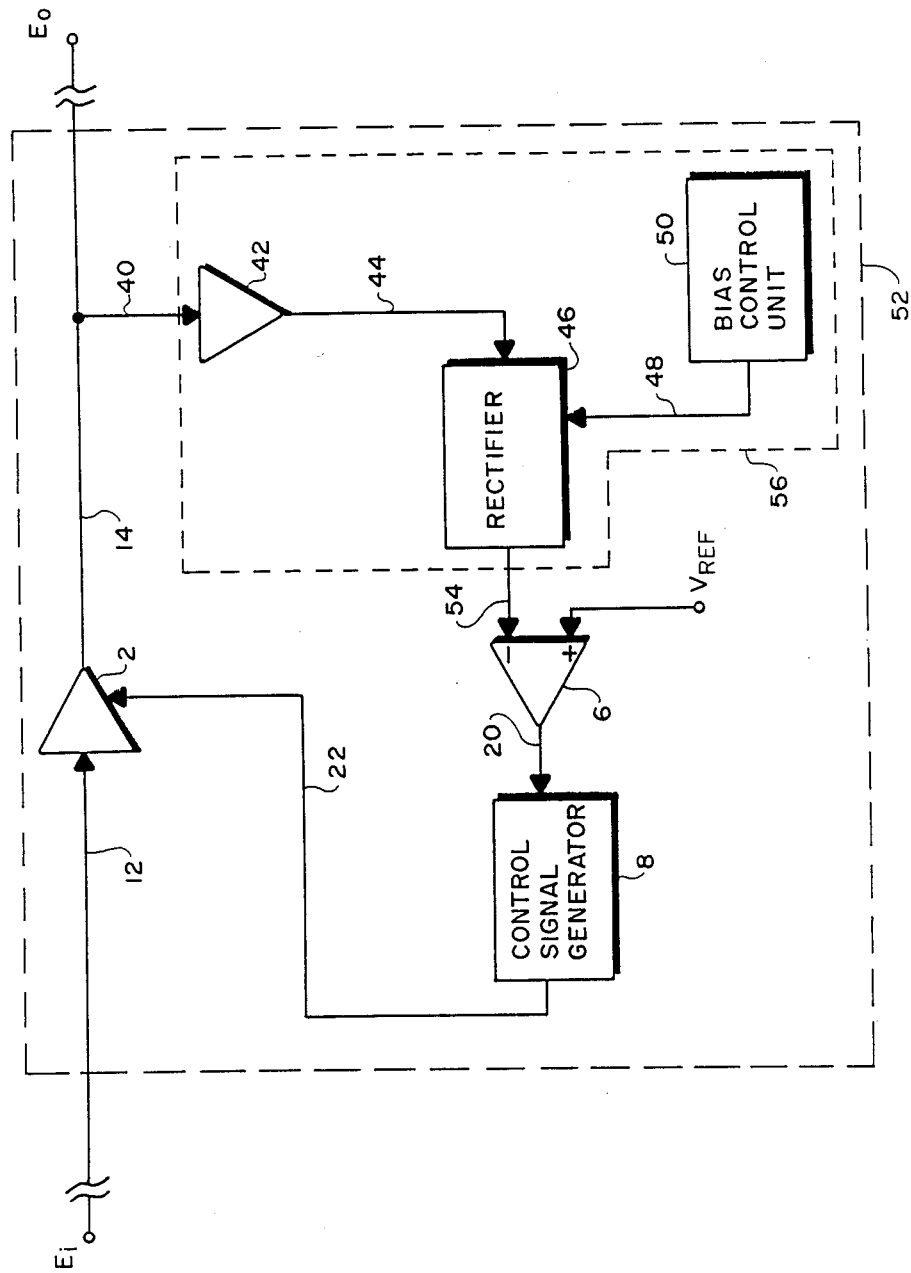
FIG. 2 is a block diagram of a controlled-output amplifer constructed in accordance with the preferred embodiment of the present invention.

FIG. 2 is a block diagram of a controlled-output amplifer 52 constructed in accordance with the preferred embodiment of the present invention. For simplicity, components, terminals and signals which are similar to those shown in FIG. 1 retain the same reference numerals. A detector 56 comprises an amplifier 42, a rectifier 46 and a bias control unit 50. An input terminal 40 of the amplifier 42 is connected to the output terminal 14. An output terminal 44 of the amplifier 42 is connected to the rectifier 46. An output terminal 48 of the bias control unit 50 is also connected to the rectifier 46 to establish a predetermined bias current through the rectifier. An output terminal 54 of the rectifier 46 is connected to the inverting input terminal of the comparator 6. The remaining components and connections are similar to those shown in FIG. 1.

Figure 3:
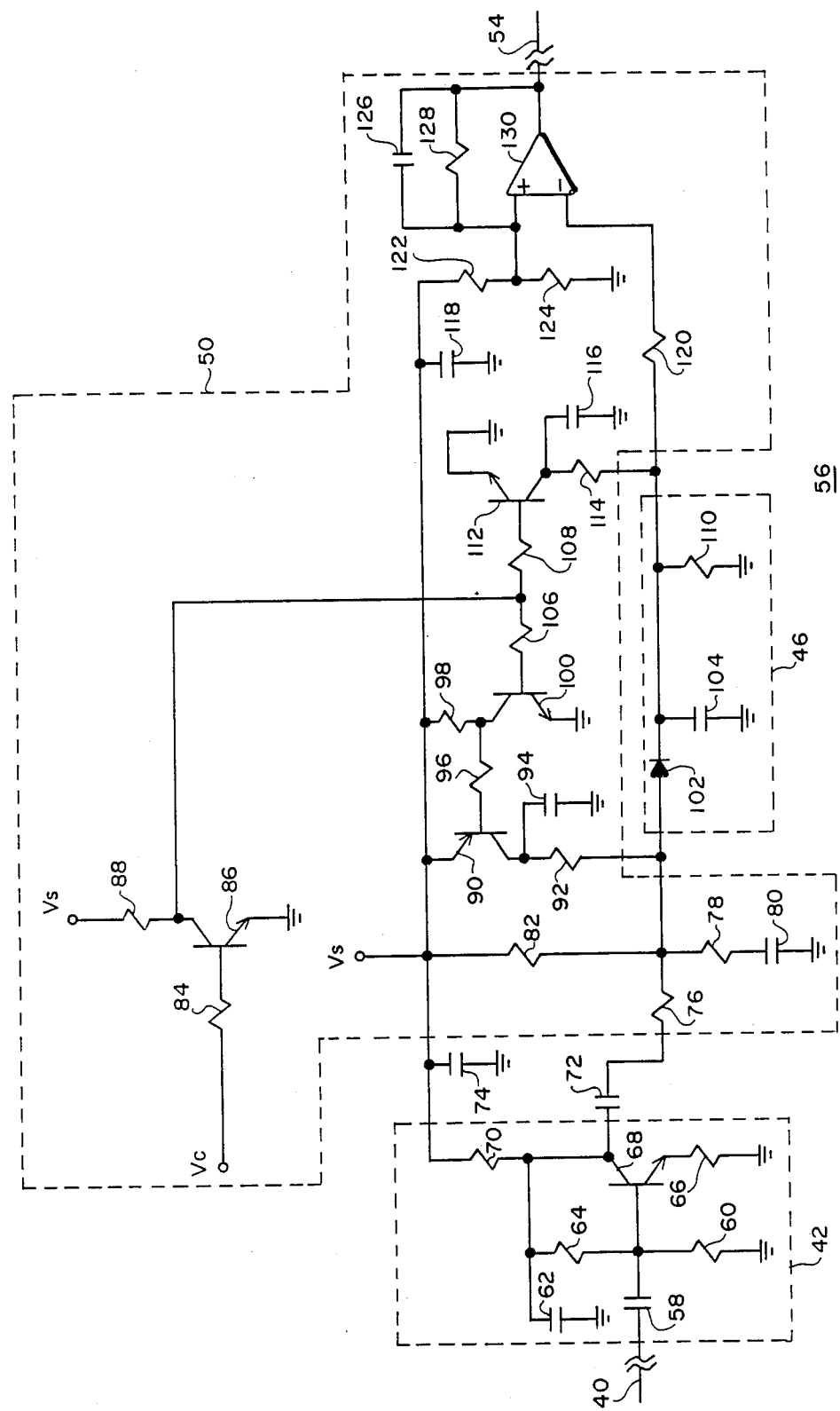
FIG. 3 is a detailed circuit diagram of the detector shown in FIG. 2.

FIG. 3 is a detailed circuit diagram of the detector 56 shown in FIG. 2. Referring now to FIGS. 2 and 3, the amplifier 42 comprises a transistor 68 in combination with resistors 60, 64, 66 and 70. A coupling capacitor 58, connected to the base of the transistor 68, couples the amplifier 42 to the input terminal 40. A source of supply voltage $V_s$ provides a DC bias voltage to the transistor 68.

The rectifier 46 comprises a detector diode 102, a capacitor 104, and a resistor 110 connected in a half-wave rectifier configuration. The collector of the transistor 68 is coupled to the rectifier 46 by a coupling capacitor 72 and a resistor 76. The output of the rectifier 46 in turn is coupled to an inverting input terminal of a comparator 130 by a resistor 120.

The bias control unit 50 comprises transistors 86, 90, 100 and 112, related capacitors and resistors, and the comparator 130 as indicated in FIG. 4. A source of control voltage $V_c$ is provided to the base of the transistor 86 through a resistor 84.

The operation of the bias control unit 50 may be summarized as follows. First, assume that the control voltage $V_c$ is sufficiently high that transistor 86 is turned on, thereby turning off transistors 100 and 112 and thus turning off transistor 90. In this bias state, the DC bias path for the detector diode 102 extends from the supply voltage $V_s$, through the resistor 82, through the diode 102 and through the resistor 110 to ground. Using the components and nominal values listed below in the Table of Components, the detector diode 102 will receive a bias current of approximately 25 μA and will therefore have a high impedance relative to the output impedance of the amplifier 42. Accordingly, a large proportion of the signal voltage received from the amplifier 42 will appear across the diode 102. Thus, the diode will exhibit a relatively high detection sensitivity, which is desirable for sensing signals of relatively small magnitudes (e.g. on the order of approximately $-12$ dBm to 2 dBm).

As described above, the forward voltage drop of the detector diode 102 will vary in response to changes in the ambient temperature. However, due to the relatively small bias current, the effect of any change in the forward voltage drop due to temperature is minimized by the increased sensitivity such that over a range of approximately $-35°$ C. to $80°$ C., the output power level of the controlled-output amplifier 52 may be maintained within $\pm 2$ dBm of the predetermined level. In this bias state, the detector diode 102 is optimally configured, both in terms of sensitivity and temperature stability, for sensing signals of relatively small magnitudes without the use of a matched compensation diode. The pre-installation testing normally required for such matched diodes is also advantageously eliminated.

Now assume that the control voltage $V_c$ is decreased sufficiently to turn off transistor 86, thereby turning on transistors 90, 100 and 112. A bias current of approximately 8 mA now flows through the detector diode 102 and the small-signal impedance of the diode is reduced (i.e. to the order of 50 ohms). The decreased impedance of the detector diode 102 attenuates signals received from the amplifier 42, which prevents the diode from being driven into saturation by signals of larger magnitude (e.g. on the order of approximately 2 dBm to 20 dBm).

Again, the forward voltage drop of the detector diode 102 will vary in response to changes in the ambient temperature. Also, due to the larger bias current, the rate of change of the forward drop with respect to temperature will increase. However, since the magnitudes of the sensed signals are larger, the change in the forward drop of the diode is still small by comparison, and the output power level of the controlled-output amplifier 52 may still be maintained within $\pm 2$ dB of the predetermined level over the same ambient temperature range as above.

It should be apparent to those having ordinary skill in the art that any number of preselected bias states may be provided to meet the requirements of a particular application.

The following Table of Components identifies components and nominal values for the detector 56 shown in FIG. 3.

| TABLE OF COMPONENTS | |
|---|---|
| Reference Number | Component Number or Nominal Value |
| $V_s$ | 8 VDC |
| 58 | 33 pF |
| 60 | 1 kilo-ohm |
| 62 | 33 pF |
| 64 | 4 kilo-ohms |
| 66 | 10 ohms |

-continued

TABLE OF COMPONENTS

| Reference Number | Component Number or Nominal Value |
|---|---|
| 68 | NE85634 |
| 70 | 47 ohms |
| 72 | 33 pF |
| 74 | .01 uF |
| 76 | 4.7 ohms |
| 78 | 470 ohms |
| 80 | 33 pF |
| 82 | 150 kilo-ohms |
| 84 | 10 kilo-ohms |
| 86 | MMBT2222 |
| 88 | 4 kilo-ohms |
| 90 | MMBT2907 |
| 92 | 680 ohms |
| 100 | MMBT2222 |
| 102 | 1SS97 |
| 104 | 33 pF |
| 106 | 4 kilo-ohms |
| 108 | 4 kilo-ohms |
| 110 | 150 kilo-ohms |
| 112 | MMBT2222 |
| 114 | 680 ohms |
| 116 | 33 pF |
| 118 | .01 uF |
| 120 | 1 kilo-ohm |
| 122 | 10 kilo-ohms |
| 124 | 68 kilo-ohms |
| 126 | 6800 pF |
| 128 | 8 kilo-ohms |
| 130 | LM2902 |

The foregoing description has been limited to a specific embodiment of this invention. It wil be apparent, however, that variations and modifications may be made to the invention, with the attainment of some or all of the advantages of the invention. Therefore, it is the object of the appended claims to cover all such variations and modifications as come within the true spirit and scope of the invention

What is claimed as new and desired to be secured by Letters Patent of the United States is:

1. A controlled-output amplifier having an input and an output, said input for receiving a preselected input signal, said output for producing an output signal having a substantially constant predetermined magnitude, said amplifier comprising:
   controllable-gain amplifier means having first and second inputs and an output, said first input adapted to receive said reselected input signal, said second input adapted to receive a gain control signal, said output providing the output signal of said controlled-output amplifier;
   rectifier means having an input and an output, said input coupled to the output of said controllable-gain amplifier means, said rectifier means producing at said output a signal indicative of the magnitude of the output signal of said controlled-output amplifier;
   bias control means having an input and an output, said input adapted to receive a bias control signal, said output coupled to the rectifier means, said control means biasing said rectifier means in one of a plurality of predetermined bias states in response to said bias control signal;
   comparison means having first and second inputs and an output, said first input coupled to the output of said rectifier means, said second input adapted to receive a reference signal, said comparison means producing a signal at said output which is indicative of the difference in magnitude of the reference signal and the signal produced at the output of said rectifier means; and
   control signal generator means having an input and an output, said input coupled to the output of said comparison means, said output coupled to the second input of the controllable-gain amplifier means, said generator means producing the gain control signal in response to the signal produced at the output of the comparison means, whereby the gain of the controllable-gain amplifier means is adjusted so as to maintain the output signal of the controlled-output amplifier at the predetermined magnitude.

2. The controlled-output amplifier as in claim 1 wherein said rectifier means further comprises an amplifier means and a half-wave rectifier means, each of said amplifier means and said half-wave rectifier means having an input and an output, the input of said amplifier means coupled to the output of said controllable-gain amplifier means, the output of said amplifier means coupled to the input of said half-wave rectifier means, and the output of said half-wave rectifier means coupled to the first input of said comparison means.

3. A controlled output amplifier as defined in claim 2 wherein:
   A. the half-wave rectifier means comprises:
      i. a diode having first and second terminals, the first terminal of the diode being coupled to the output of the amplifier means; and
      ii. a capacitor, coupled to the second terminal of the diode and to the output of the rectifier means to provide the voltage of the capacitor as the signal at the output of the rectifier means; and
   B. the output of the bias-control means is coupled across the first and second terminals of the diode to vary the current that flows in the diode when the AC voltage is zero at the output of the amplifier means.

4. A controlled output amplifier as defined in claim 1 wherein:
   A. the rectifier means comprises:
      i. a diode having first and second terminals, the first terminal of the diode being coupled to the output of the controlled output amplifier means; and
      ii. a capacitor, coupled to the second terminal of the diode and to the output of the rectifier means to provide the voltage of the capacitor as the signal at the output of the rectifier means; and
   B. the output of the bias-control means is coupled across the first and second terminals of the diode to vary the current that flows in the diode when the AC voltage is zero at the output of the controlled output amplifier means.

* * * * *